United States Patent [19]

Honda et al.

[11] Patent Number: 5,612,304
[45] Date of Patent: Mar. 18, 1997

[54] REDOX REAGENT-CONTAINING POST-ETCH RESIDUE CLEANING COMPOSITION

[75] Inventors: Kenji Honda, Barrington; Rodney Hurditch, Providence, both of R.I.

[73] Assignee: Olin Microelectronic Chemicals, Inc., Cheshire, Conn.

[21] Appl. No.: 499,355

[22] Filed: Jul. 7, 1995

[51] Int. Cl.$^6$ .............. C11D 7/32; C11D 7/26; C11D 7/34; C11D 7/50

[52] U.S. Cl. ............ 510/176; 510/175; 510/490; 510/500; 510/493; 430/331; 430/256; 430/258

[58] Field of Search ............... 252/546, 548, 252/153; 430/331, 256, 258; 510/176, 175, 490, 500, 493

[56] References Cited

U.S. PATENT DOCUMENTS

| | | | |
|---|---|---|---|
| 4,306,933 | 12/1981 | De Fonte, Jr. | 156/644 |
| 4,309,300 | 1/1982 | Danforth et al. | 252/170 |
| 4,592,787 | 6/1986 | Johnson | 134/38 |
| 4,617,251 | 10/1986 | Sizensky et al. | 430/256 |
| 4,720,332 | 1/1988 | Coffey | 204/146 |
| 4,770,713 | 9/1988 | Ward | 134/38 |
| 4,786,578 | 11/1988 | Neisius et al. | 430/256 |
| 4,824,762 | 4/1989 | Kobayashi et al. | 430/258 |
| 4,824,763 | 4/1989 | Lee | 430/258 |
| 4,904,571 | 2/1990 | Miyashita et al. | 430/331 |
| 4,944,893 | 7/1990 | Tanaka et al. | 252/171 |
| 5,073,622 | 12/1991 | Wojtech | 528/486 |
| 5,279,791 | 1/1994 | Lee | 252/548 |
| 5,334,332 | 8/1994 | Lee | 252/548 |
| 5,378,802 | 1/1995 | Honda | 528/480 |
| 5,417,877 | 5/1995 | Ward | 252/153 |
| 5,419,779 | 5/1995 | Ward | 134/38 |
| 5,472,830 | 12/1995 | Honda | 430/331 |
| 5,480,585 | 1/1996 | Shiotsu et al. | 252/544 |
| 5,507,978 | 4/1996 | Honda | 252/544 |

FOREIGN PATENT DOCUMENTS

| | | |
|---|---|---|
| 3828513 | 3/1990 | Germany . |
| 56-115368 | 9/1981 | Japan . |
| 63-208043 | 8/1988 | Japan . |
| 1-081949 | 3/1989 | Japan . |
| 64-088548 | 4/1989 | Japan . |
| 4-124668 | 4/1992 | Japan . |
| 4-350660 | 12/1992 | Japan . |
| 5-045894 | 2/1993 | Japan . |

*Primary Examiner*—Michael Tierney
*Attorney, Agent, or Firm*—William A. Simons; Todd E. Garabedian

[57] ABSTRACT

A noncorrosive post-etch residue cleaning composition containing:

(a) 1–70% by weight of an organic polar solvent having a dipole moment of more than 3.5;

(b) 1–70% by weight of selected amine compounds having at least one hydroxyl group and a boiling point higher than 150° C. at atmospheric pressure;

(c) 0.1–10% by weight of selected amino acid having at least one hydroxyl group;

(d) 1–20% by weight of selected redox reagent having a redox potential in the range between +1.0 V and −2.0 V vs. SHE (at pH=7); and (e) 0–90% by weight of water.

21 Claims, No Drawings

REDOX REAGENT-CONTAINING POST-ETCH RESIDUE CLEANING COMPOSITION

BACKGROUND OF THE INVENTION

1. Field of the Invention

The present invention relates to a noncorrosive cleaning composition for metal oxide-type, post-etch residues which contain the combination of (1) selected solvents; (2) selected amines; (3) selected corrosion inhibitors; (4) selected redox reagents; optionally (5) water.

2. Description of the Prior Art

The photoresist stripper art is replete with numerous references to stripper combinations containing both a polar solvent and an amine compound. The presence of an amine in photoresist stripper compositions has been judged to be essential to effectively remove resist film cross-linked by baking, plasma etching, ion implantation, or other LSI device manufacturing processes. However, amine-type photoresist strippers sometimes have a serious problem of corrosion, especially with aluminum substrates.

It is believed that this corrosion proceeds by the ionization of water by the amine in post-stripping water rinses, as residual stripper solution may be retained on the substrate surface and/or substrate carrier after the stripping step. In other words, the amine component of the stripper composition does not corrode the substrate, but may trigger water to cause the corrosion.

To solve this problem, an intermediate rinse step with an organic solvent has been used between the stripping step and the post-stripping rinse with water. For example, isopropyl alcohol is known to be useful for this purpose. However, such intermediate rinses are not necessarily desirable because overall stripping operation becomes more complicated and, furthermore, an additional solvent waste is produced. Accordingly, if amine-type strippers are to be further employed, there is a need to solve this corrosion problem without intermediate organic solvent washes. The present invention provides such a solution.

During anisotropic plasma etching processes for via contacts, metal patterns, and passivation openings, "sidewall residues" are frequently deposited on the resist sidewall. After the oxygen plasma ashing of photoresist films, these residues become metal oxides. Incomplete removal of these residues interfere with the pattern definition and/or complete filling of via-holes.

Several different chemistries have been identified for removing the post-etch residues, in particular of the metal oxide type. For example, alkaline developers such as aqueous tetramethyl-ammonium hydroxide (TMAH) are known to attack aluminum so that an aluminum oxide can be etched with TMAH. However, other types of the post-etch residues associated with multi-metal systems such as Al/Si/Cu cannot be so easily removed with TMAH. TMAH also is ineffective on residues from polysilicon plasma etch processes.

The metal oxide type sidewall residues can also be removed with: (1) a mixture of HF and ethylene glycol ether or (2) a mixture of nitric acid, acetic acid, and hydrofluoric acid. These solutions require extreme process control to prevent excessive attack of critical metal and oxide layers. In some device structures, these solutions are not useable because of their nonselective attack mechanisms.

Recently, Wai M. Lee described at The Interconnects, Contact Metallization and Multilevel Metallization Symposium (183rd Spring Meeting) of The Electrochemical Society, Inc. in Honolulu, Hi., May 16–21, 1993, that a hydroxylamine-containing stripper composition can remove some kinds of the sidewall residues.

Although hydroxylamine has a potential to remove the metal oxide type of the post-etch residues, it is not stable upon heating.

Accordingly, hydroxylamine is not suitable for the use of stripping of photoresist films or removing of the post-etch residues at higher temperatures.

Illustrative references suggesting photoresist stripper composition containing the combination of a polar solvent and an amine compound are the following:

1. U.S. Pat. No. 4,617,251, which issued to Sizensky et al. on Oct. 14, 1986, teaches a positive photoresist stripping composition containing (A) selected amine compound (e.g., 2-(2-aminoethoxy)-ethanol; 2-(2-aminoethylamino)-ethanol; and mixtures thereof) and (B) selected polar solvents (e.g., N-methyl-2-pyrrolidinone, tetra-hydrofurfuryl alcohol, isophorone, dimethyl sulfoxide, dimethyl adipate, dimethyl glutarate, sulfolane, gamma-butyrolactone, N,N-dimethyl-acetamide and mixtures thereof). The reference further teaches that water as well as dyes or colorants, wetting agents, surfactants and antifoamers may be added into this composition.

2. U.S. Pat. No. 4,770,713, which issued to Ward on Sep. 13, 1988, teaches a positive photoresist stripping composition containing (A) a selected amide (e.g., N,N-dimethyl acetamide; N-methyl acetamide; N,N-diethyl acetamide; N,N-dipropyl acetamide; N,N-dimethyl propionamide; N,N-diethyl butyramide and N-methyl-N-ethyl propionamide) and (B) selected amine compound (e.g., monoethanolamine, monopropanolamine, methylamino-ethanol). The patent also teaches this stripper may optionally contain a water miscible nonionic detergent (e.g., alkylene oxide condensates, amides and semi-polar nonionics).

3. U.S. Pat. No. 4,786,578, which issued to Neisius et al. on Nov. 22, 1988, teaches a rinse solution used after a photoresist stripper, said rinse solution containing (A) a nonionic surfactant (e.g., ethoxylated alkylphenol, fatty and ethoxylate, fatty alcohol ethoxylate or ethylene oxide/propylene oxide condensate) and (B) an organic base (e.g., mono-, di-, or tri-ethanolamine).

4. U.S. Pat. No. 4,824,762, which issued to Kobayashi et al. on Apr. 25, 1989, teaches photoresist stripping post-rinse solution containing (A) glycol ether (e.g., diethylene glycol monomethyl ether, dipropylene glycol monomethyl ether, tripropylene glycol monomethyl ether) and (B) an aliphatic amine (e.g., monoethanolamine or tri-isopropylamine).

5. U.S. Pat. No. 4,824,763, which issued to Lee on Apr. 25, 1989, teaches positive-working photoresist stripping composition containing (A) triamine (e.g., diethylene-triamine) and (B) non-polar solvent (e.g., N-methyl-2-pyrrolidone, dimethylformamide, butyrolactone, aliphatic hydrocarbons, aromatic hydrocarbons, chlorinated hydrocarbons).

6. U.S. Pat. No. 4,904,571, which issued to Miyashita et al. on Feb. 27, 1990, teaches printed circuit board photoresist stripper composition containing (A) a solvent (e.g., water, alcohols, ethers, ketones, chlorinated hydrocarbons and aromatic hydrocarbons); (B) an alkaline compound dissolved in said solvent (e.g., primary amines, secondary amines, tertiary amines, cyclic amines, polyamines, quaternary ammonium amines, sulfonium hydroxides, alkali hydroxides, alkali carbonates, alkali phosphates and alkali pyrophosphates); and (C) a borohydride compound dissolved in said solvent (e.g., sodium borohydride, lithium borohydride, dimethyl amine borone, trimethyl amine borone, pyridane borone, tert-butyl amine borone, triethyl amine borone, and morpholine borone).

7. German Published Patent Application No. 3828513, which published on Mar. 1, 1990 and is assigned to Merck patent GMBH, teaches a positive and negative photoresist stripper composition containing (A) an aprotic polar solvent (e.g., 1,3-dimethyl-2-imidazolidinone or 1,3-dimethyl-tetrahydro-pyrimidinone); and (B) an organic base (e.g., alkanolamine).

8. Japanese Published Pat. Application No. 56-115368, which was published on Sep. 10, 1981 and is assigned to San Ei Chemical Industries, KK, teaches a photoresist stripping composition containing (A) nonionic surface activator (e.g., a polyethylene glycol ether); (B) organic solvent (e.g., cyclohexanone); and (C) either a swelling agent (e.g., polyethylene glycol) or penetrant (e.g., 2-aminoethanol).

9. Japanese Published Pat. Application No. 63-208043, published on Aug. 29, 1988, teaches a positive-working photoresist stripper composition containing (A) 1,3-dimethyl-2-imidazolidinone; (B) a water-soluble organic amine (e.g., monoethanolamine, 2-(2-aminoethoxy)-ethanol, triethylene(tetramine). The application also teaches a surfactant may be added to the stripper.

10. Japanese Published Patent Application No. 1-081949, which published on Mar. 28, 1989 and is assigned to Asahi Chemical, teaches a positive-working photoresist stripper composition containing (A) gamma-butyrolactone, N-methyl-formamide, N,N-dimethylformamide, N,N-dimethylacetoamide or N-methylpyrrolidone; (B) an amino alcohol (e.g., N-butyl-ethanolamine and N-ethyldiethanolamine); and (C) water.

11. Japanese Published Patent Application No. 4-350660, which is assigned to Texas Instruments, Japan and Kanto Chemical, Inc., teaches a stripper for positive photoresists comprising (A) 1,3-dimethyl-2-imidazolidinone (DMI), (B) dimethyl-sulfoxide (DMSO) and (C) a water-soluble amine (e.g., monoethanolamine or 2-(2-aminoethoxy)ethanol wherein the amount of the water-soluble amine is 7–30% by weight.

12. U.S. Pat. No. 5,279,791, which issued to Lee on Jan. 18, 1994, teaches a stripping composition for removing resists from substrates containing (A) hydroxylamine (e.g., NH$_2$OH); (B) at least one alkanolamine; and optionally (C) at least one polar solvent.

13. Japanese Published Patent Application No. 7-28254, which is assigned to Kanto Chemical, Inc., teaches a stripper for the sidewall residues comprising (a) a selected compound from sugar alcohols, isopropylalcohol, dimethylsulfoxide, and 1,3-dimethyl-2-imidazolidininone; (b) alkanolamine; (c) water; and optionally (d) quaternary ammonium hydroxides.

None of these references suggest a complete solution for removing post-etch residues, particularly for the metal oxide type, without corrosion.

BRIEF SUMMARY OF THE INVENTION

The present invention, therefore, is directed to a post-etch residue cleaning composition comprising:

(a) from about 1 to about 70% by weight of an organic polar solvent having a dipole moment of more than 3.5;

(b) from about 1 to about 70% by weight of an amine compound having at lest one hydroxyl group per molecule and having a boiling point higher than 150° C. at atmospheric pressure; and (c) from about 0.1 to about 10% by weight of an amino acid selected from the group consisting of compounds having the formula (I):

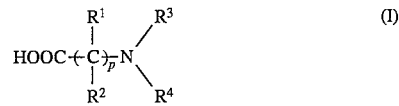

wherein p is an integer ranging from 1–3; $R^1$ and $R^2$ are each independently selected from the group consisting of hydrogen and compounds having the formula (II):

wherein $R^5$, $R^6$, and $R^7$ are each independently selected from hydrogen, —OH, —CH$_2$OH, alkyl, alkoxy, phenyl, mono-, di-, or tri-hydroxy-substituted phenyl groups; and $R^3$ and $R^4$ are each independently selected from the group consisting of hydrogen and compounds having the formula (III):

wherein X', Y', and Z' are each independently selected from hydrogen, OH, —CH$_2$OH, —CH$_2$CH$_2$OH, —CH$_2$COOH, alkyl, or alkoxy group, and at least one of them is —OH, —CH$_2$CH$_2$OH, or —CH$_2$OH;

(d) from about 1 to about 20% by weight of a redox reagent having a redox potential in the range between +1.0 $\overline{V}$ and –2.0 $\overline{V}$ vs. SHE (at pH =7); and (e) optionally, from 0 to about 90% by weight of water.

DESCRIPTION OF THE PREFERRED EMBODIMENTS

As stated above, the noncorrosive post-etch cleaner of the present invention has four critical components, namely:

(a) a polar solvent having a dipole moment of at least 3.5;

(b) an amine having at least one hydroxyl group per molecule and a boiling point higher than about 150° C. at atmospheric pressure;

(c) an amino acid having at least one hydroxyl group;

(d) a redox reagent having a redox potential in the range between +1.0 $\overline{V}$ and –2.0 $\overline{V}$ vs. SHE (at pH=7); and (e) optionally, water.

The solvent used in this stripper composition should have a good solubility for other stripper components. The solvent is also necessary to efficiently remove cross-linked resist films which are strongly adhering to the substrate in combination with the amine.

The solvent should meet the following criteria:

(1) Its dipole moment should be more than 3.5.

(2) Its boiling point should preferably be more than 150°–180° C.

(3) Its flash point should preferably be more than 80°–90° C.

Among various candidates, amides and sulfoxides are particularly preferred. In particular, cyclic amides such as N-alkyl-2-pyrrolidones (e.g., N-hydroxyethyl-2-pyrrolidone) or 1,3-dialkyl-2-imidazolidinones well as sulfoxides such as dimethylsulfoxide (DMSO) are especially preferable from a view point of stripping power and toxicity. A suitable solvent mixture may be an admixture of N-hydroxyethylpyrrolidone (HEP) with 1,3-dimethyl-2-imidozolidinone (DMI) or dimethylsulfoxide (DMSO) wherein the mixing ratio of HEP:DMI or DMSO is from about 95:5% to about 5:95% by weight as HEP is a known safer solvent and DMI is a powerful stripping solvent.

As mentioned above, another major component of the cleaner is an amine compound. Alkanolamines are particularly preferable. But some of them cannot efficiently dissolve cross-linked resist films by themselves, probably because of their high viscosity. In this case, those amines can be used with the above-mentioned polar solvents so that the resulting stripper solutions have a moderate viscosity.

Various amines can be used in the cleaner composition of this invention. Particularly, amines having at least one hydroxyl group, so-called alkanolamines, are the most preferable; for example, monoethanolamine, diethanolamine, triethanolamine, 2-(2-aminoethoxy)ethanol, 2-(2-aminoethyl-amino)ethanol, and the like.

The third critical component is a selected amino acid compound working as a corrosion inhibitor.

Examples of compounds within this class include: tricine, bicine, DL-homoserine, D-homoserine, L-homoserine, DL-threonine, D-allo-threonine, L-allo-threonine, D-threonine, L-threonine, DL-3-hydroxynorvaline, DL-methyltyrosine, D-4-hydroxyphenylglycine, DL-tyrosine, D-tyrosine, L-tyrosine, 3-(3,4-dihydroxyphenyl)-DL-alanine, 3-(3,4-dihydroxyphenyl)-L-alanine, 3-(2,4,5-trihydroxyphenyl)-DL-alanine, DL-alpha-methyltyrosine, L-alphamethyltyrosine, (−)-3-(3,4-dihydroxyphenyl)-2-methyl-L-alanine, DL-threo-3-phenylserine, DL-threo-3,4-dihydroxyphenylserine, and the like. Preferable candidates among them are tricine, bicine, 3-(3,4-dihydroxyphenyl)-DL-alanine, 3-(2,4,5-trihydroxyphenyl)-DL-alanine, and DL-threo-3,4-dihydroxyphenylserine, in terms of cost/performance balance.

Examples of compounds outside the formula (I) which may be also useful for this function include: DL-4-amino-3-hydroxybutyric acid, (3's, 4's)-(−)-statine, (+)-muramic acid, 5-hydroxy-DL-lysine, cis-4-hydroxy-D-proline, cis-4-hydroxy-L-proline, trans-4-hydroxy-L-proline, mimosine, N-(4-hydroxy-phenyl)glycine, 3,3'5-triiodo-L-thyronine, D-thyroxine, L-thyroxine, D-4-hydroxyphenylglycine, 3-nitro-L-tyrosine, 3-amino-L-tyrosine, 3,5-dinitro-L-tyrosine, chloroacetyl-L-tyrosine, N-acety-1-tryosinamine, and the like.

It has been found that the presently claimed amino acid compounds of formula (I) can effectively inhibit corrosion without any damage of the stripping power of the claimed amines. For example, it is believed that amino acids having hydroxyl groups can form a complex with amines in stripper solutions to reduce basicity of stripper solution. This results in retardation of the corrosion.

In contrast, if an organic or inorganic acid is used instead of the compounds of formula (I), basicity of the amine-containing stripper solution is so much decreased that the stripper power can also be degraded as well. In other words, it is important to choose a moderate acidity of additives as a corrosion inhibitor. In particular, amino acids having hydroxyl group are desirable because the hydroxyl group attached can contribute to enhance a solubility of the resulting complex with amines.

The fourth critical component is a selected redox reagent working as a remover of the post-etch residues, particularly for the metal oxides. The metal oxides, such as $SiO_2$ and $Al_2O_3$ are not soluble in organic solvents at all and slightly soluble in water, particularly at high pH. The conventional stripper compositions do not dissolve these compounds.

To solubilize typical metal oxides formed by the typical plasma etching and oxygen plasma ashing processes, the redox reagents used in this invention should have a redox potential in the range from +1.0 $\overline{V}$ to −2.0 $\overline{V}$ vs. SHE at pH=7, more preferably in the range from +0.2$\overline{V}$ to −1.0 $\overline{V}$.

Examples of the redox reagents within this class include: (a) sugar alcohols such as erythritols, pentitols (e.g., D-arabitol and D-xylitol), hexitols (e.g., D-sorbitol and D-mannitol), and related reduced-type carbohydrates; (b) other types of alcohols such as methyl alcohol, ethyl alcohol, isopropyl alcohol, and related derivatives; (c) phenolic compounds such as catechol, cresol, hydroquinone, trinitrophenol, and related derivatives; (d) amines like piperidine, ethylamine aniline, o-phenylene diamine, hydrazine, and related compounds; (e) dyes such as methylene blue, phenosafranine, neutral red, eriogreen, and related compounds; (f) other reducing reagents like acetic acid, oxalic acid, acetone, 1,10-phenanthroline, benzidine, and related compounds.

Optionally, water (preferably, deionized water) can be added to the cleaner composition of this invention, because some combinations of amines and amino acids tend to form a complex which is least soluble in organic solvents depending on a molar ratio of these two components. In that case, water is helpful to stabilize the stripper solution without precipitation. It should be noted that the presence of the amino acid will prevent corrosion occurring, even when water is present in the amine-containing cleaner composition.

The preferred amounts of these five ingredients are about 2–50% polar solvent; about 2–50% amine compound; about 0.5–8% amino acid corrosion inhibitor; about 3–10% redox reagent; and optionally about 0–50% water, all based on the weight of the cleaner composition.

Various other ingredients known to those skill in the art may optionally be included in the stripping composition, e.g., dyes or colorants, wetting agents, surfactants, antiroamers and so forth. Generally, the amount of each of these optional ingredients would be about 0.1–0.5% by weight, based on the total cleaner composition.

The described cleaner composition is used in removing post-etch residues, specially metal oxide type residues formed by oxygen plasma ashing of photoresist films after plasma etching of a metalized wafer. The method of the invention is carried out by contacting the metal oxide type residues with the described cleaner solution. The actual conditions, i.e., temperature, time, and the like, may vary over wide ranges and are generally dependent on the nature and thickness of the post-etch residues to be removed, as well as other factors familiar to those skilled in the art. In general, however, temperatures ranging from about 15° C. to about 100° C. for a period of about 5 minutes to about 60 minutes are typical.

A variety of means can be employed in contacting the post-etch residues with the cleaner solution in the practice of the invention. For example, the substrate containing the residues can be immersed in a cleaner bath or the cleaner solution can be sprayed over the surface of the post-etch residues, as will be apparent to those skilled in the art.

The present invention is further described in detail by means of the following Examples and Comparisons. All parts and percentages are by weight and all temperatures are degrees Celsius unless explicitly stated otherwise.

EXAMPLE 1

A test wafer was prepared by CVD oxidation of the surface of silicon wafer, followed by sputtering Al-Cu-Si (Si 1 wt. %; Cu 0.5 wt. %) onto the silicon oxide layer. Thus prepared wafers were coated with a positive photoresist film, OiR 32 produced at OCG, at a film thickness of 1.0 μm, baked, exposed imagewise, and developed under ordinary conditions. Then, the patterned wafers were baked at 150° C. for 30 minutes and etched with a chlorine gas-based plasma, followed by oxygen plasma ashing of the photoresist film.

Thus obtained wafers, on which metal oxide type of the post-etch residues were remaining, were immersed in a bath of the cleaning solution which is consisting of N-methyl-2-pyrrolidone (5 wt. %), diethyleneglycolamine (5 wt. %), tricine (3 wt. %), D-sorbitol (5 wt. %), and deionized water (82 wt. %) at 25° C. for 60 seconds, followed by water rinse for 3 minutes.

The wafer surface was observed under microscope to see the residues remaining. The surface resistivity was also determined to measure the corrosion of the metal substrate. The post-etch residues were completely removed and no corrosion was detected.

EXAMPLE 2

The preparation of the test wafer and the method of the test were the same as described in Example 1. The cleaning composition in this example was consisting of N-methyl-2-pyrrolidone (35 wt. %), diethyleneglycolamine (35 wt. %), bicine (5 wt. %), D-arabitol (5 wt. %), and deionized water (20 wt. %), There were no remaining post-etch residues and no corrosion was observed on the wafer surface.

Reference 1

All the test procedures were the same as in Example 1, except for the cleaning composition. In this example, the test sample consisted of N-methyl-2-pyrrolidone (5 wt. %), diethyleneglycolamine (5 wt. %), D-sorbitol (5 wt. %), and deionized water (85 wt. %).

The post-etch residues were completely removed but the metal surface of the substrate was significantly corroded compared with the above examples.

Reference 2

All the test procedures were the same as in Example 1, except for the cleaning composition. In this example, the test sample consisted of N-methyl-2-pyrrolidone (35 wt. %), diethyleneglycolamine (35 wt. %), bicine (5 wt. %), and deionized water (25 wt. %).

The post-etch residues were not removed like Examples 1 and 2, and the metal surface of the substrate was not corroded like Reference 1.

While the invention has been described above with reference to specific embodiments thereof, it is apparent that many changes, modifications, and variations can be made without departing from the inventive concept disclosed herein. Accordingly, it is intended to embrace all such changes, modifications, and variations that fall within the spirit and broad scope of the appended claims. All patent applications, patents, and other publications cited herein are incorporated by reference in their entirety.

What is claimed is:

1. A post-etch residue cleaner composition, comprising:
   (a) from about 1 to about 70% by weight of an organic polar solvent having a dipole moment of more than 3.5;
   (b) from about 1 to about 70% by weight of an alkanolamine compound having a boiling point higher than 150° C. at atmospheric pressure;
   (c) from about 0.1 to about 10% by weight of an amino acid selected from the group consisting of compounds having the formula (I):

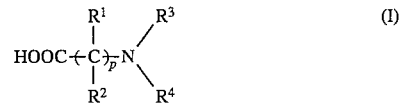

wherein p is an integer ranging from 1–3; $R^1$ and $R^2$ are each independently selected from the group consisting of hydrogen and compounds having the formula (II):

wherein $R^5$, $R^6$, and $R^7$ are each independently selected from hydrogen, —OH, —CH$_2$OH, alkyl, alkoxy, phenyl, and mono-, di- or tri-hydroxy-substituted phenyl groups; and $R^3$ and $R^4$ are each independently selected from the group consisting of hydroxy and compounds having the formula (III):

wherein X', Y', and Z' are each independently selected from hydrogen, —OH, —CH$_2$OH, —CH$_2$CH$_2$OH, alkyl, or alkoxy group, and at least one of them is —OH, —CH$_2$OH or —CH$_2$CH$_2$OH;
   (d) from about 1 to about 20% by weight of a redox reagent having a redox potential in the range between +1.0 V and −2.0 V vs. SHE (at pH=7) selected from the group consisting of sugar alcohols, piperidine, aniline, o-phenylenediamine, hydrazine, 1,10-phenanthroline and benzidine; and
   (e) optionally, from about 0% to about 90% by weight of water; all percents based on the total weight of the cleaner composition.

2. The cleaner composition of claim 1, wherein said solvent (a) comprises a cyclic amide.

3. The cleaner composition of claim 2, wherein said cyclic amide is selected from the group consisting of N-alkyl-2-pyrrolidones and 1,3-dialkyl-2-imidazolidinones.

4. The cleaner composition of claim 2, wherein said solvent (a) is an admixture of N-hydroxyethyl-pyrrolididone (HEP) with 1,3-dimethyl-2-imidozolidinone (DMI) wherein the ratio of HEP:DMI is from about 95:5% to about 5:95% by weight.

5. The cleaner composition of claim 1, wherein said solvent (a) comprises dimethylsulfoxide.

6. The cleaner composition of claim 1, wherein said solvent (a) is an admixture of N-hydroxyethyl-pyrrolididone (HEP) with dimethylsulfoxide (DMSO) wherein the ratio of HEP:DMSO is from 95:5% to about 5.95% by weight.

7. The cleaner composition of claim 12, wherein said alkanolamine is selected from the group consisting of monoethanolamine, diethanolamine, triethanolamine, 2-(2-aminoethoxy)ethanol and 2-(2-aminoethylamino)ethanol.

8. The cleaner composition of claim 1, wherein said redox reagent (d) is a sugar alcohol.

9. The cleaner composition of claim 8, wherein said sugar alcohol is selected from the group consisting of erythritols, penitols, and hexitols.

10. The cleaner composition of claim 9, wherein said sugar alcohol is a penitol and is selected from the group consisting of D-arabitol and D-xylitol.

11. The cleaner composition of claim 9, wherein said sugar alcohol is a hexitol and is selected from the group consisting of D-sorbitol and D-mannitol.

12. The cleaner composition of claim 1, wherein said redox reagent (d) is piperidine.

13. The cleaner composition of claim 1, wherein said redox reagent (d) is aniline.

14. The cleaner composition of claim 1, wherein said redox reagent (d) is o-phenylenediamine.

15. The cleaner composition of claim 1, wherein said redox reagent (d) is hydrazine.

16. The cleaner composition of claim 1, wherein said redox reagent (d) is 1,10-phenanthroline.

17. The cleaner composition of claim 1, wherein said redox reagent (d) is benzidine.

18. The cleaner composition of claim 1, wherein said redox reagent (d) is present from about 3% to about 10% by weight, based on the total weight of said cleaner composition.

19. The cleaner composition of claim 1, wherein said amino acid (c) is selected from the group consisting of tricine, bicine, DL-homoserine, D-homoserine, L-homoserine, DL-threonine, D-allo-threonine, L-allo-threonine, D-threonine, L-threonine, DL-3-hydroxy-norvaline, DL-methyltyrosine, D-4-hydroxyphenylglycine, DL-tyrosine, D-tyrosine, L-tyrosine, 3-(3,4-dihydroxyphenyl)-DL-alanine, 3-(3,4-dihydroxyphenyl)-L-alanine, 3-(2,4,5-trihydroxyphenyl)-DL-alanine, DL-alphamethyltyrosine, L-alpha-methyltyrosine, (—)-3-(3,4-dihydroxyphenyl)-2-methyl-L-alanine, DL-threo-3-phenylserine, and DL-threo-3,4-dihydroxyphenylserine.

20. The cleaner composition of claim 18, wherein said amino acid is selected from the group consisting of tricine, bicine, 3-(3,4-dihydroxyphenyl)-DL-alanine, 3-(2,4,5-trihydroxyphenyl)-DL-alanine, and DL-threo-3,4-dihydroxyphenylserine.

21. The cleaner composition of claim 1, wherein said cleaner composition further comprises water.

* * * * *